United States Patent

[11] 3,600,648

[72] Inventor Thomas A. Longo
Winchester, Mass.

[21] Appl. No. 449,759
[22] Filed Apr. 21, 1965
[45] Patented Aug. 17, 1971
[73] Assignee Sylvania Electric Products Inc.

[54] SEMICONDUCTOR ELECTRICAL TRANSLATING DEVICE
3 Claims, 5 Drawing Figs.

[52] U.S. Cl. .......... 317/235 R, 317/235 X, 317/235 AH
[51] Int. Cl. .......... H01l 11/06
[50] Field of Search .......... 317/235

[56] References Cited

UNITED STATES PATENTS

| | | | |
|---|---|---|---|
| 2,980,830 | 4/1961 | Shockley | 317/235 |
| 3,040,266 | 6/1958 | Forman | 317/235 X |
| 3,063,023 | 11/1962 | Dacey et al. | 332/29 |
| 3,097,308 | 7/1963 | Wallmark | 317/235 X |
| 3,197,681 | 7/1965 | Broussard | 317/235 |
| 3,204,160 | 8/1965 | Sah | 317/235 |
| 3,206,827 | 9/1965 | Kriegsman | 317/235 X |
| 3,237,271 | 3/1966 | Arnold et al. | 317/235 X |
| 3,271,201 | 9/1966 | Pomerantz | 317/235 X |
| 3,280,391 | 10/1966 | Bittmann et al. | 317/234 |
| 3,302,076 | 1/1967 | Kang et al. | 317/234 |

FOREIGN PATENTS

| | | | |
|---|---|---|---|
| 954,534 | 4/1964 | Great Britain | 317/235 |
| 998,388 | 7/1965 | Great Britain | 317/235 |
| 1,339,897 | 9/1963 | France | 317/235 |
| 1,361,215 | 4/1964 | France | 317/235 |

OTHER REFERENCES

Electronic News, 9-28-1964.

Extract from Texas Instruments Booklet— New Product Review for Wescon; 1964.

Article titled, " Electrode Control of Si02— Passivated Junctions," by Castrucci and Logan found in Reprint of IBM Journel of Research and Developemnt, Vol. 8, No. 4, September 1964, pp. 394— 399

*Primary Examiner*—Jerry D. Craig
*Attorneys*—Norman J. O'Malley, Elmer J. Nealon and David M. Keay

ABSTRACT: Double-diffused planar-type transistor having a layer of conductive material overlying the oxide coating protecting the edge of the base-collector junction in order to prevent inversion of the semiconductor material in the region of the junction.

PATENTED AUG 17 1971

3,600,648

Figure 1:
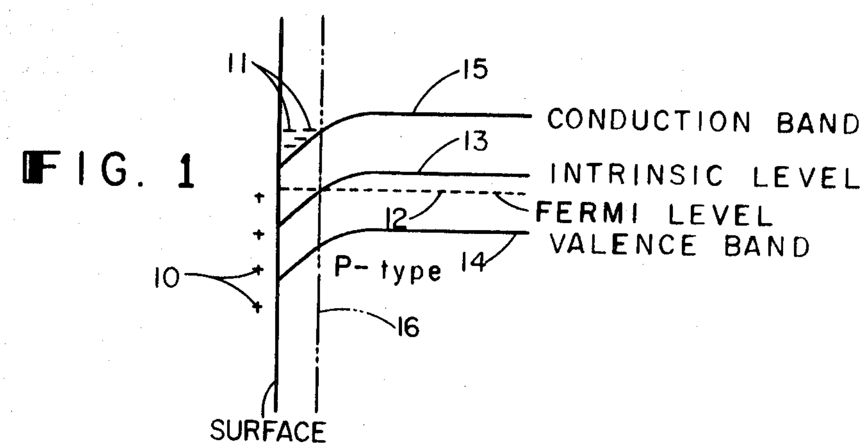

INVENTOR.
THOMAS A. LONGO

BY David M. Keay

AGENT.

SEMICONDUCTOR ELECTRICAL TRANSLATING DEVICE

This invention relates to semiconductor electrical translating devices. More particularly, it is concerned with semiconductor devices having surface regions of high resistivity semiconductor material which are susceptible to the formation of inversion layers and with prevention of the formation of such layers.

Certain types of well-known semiconductor devices have surface regions of high resistivity semiconductor material which are contiguous other surface regions of opposite conductivity type. The surface of the semiconductor material is protected by an adherent coating of a nonconductive material which covers the edge of the junction between the regions of different conductivity types.

The double-diffused epitaxial transistor is a device of this type. This transistor is produced by the epitaxial deposition of a layer of high resistivity semiconductor material of one conductivity type on a heavily doped substrate of the semiconductor material of the same conductivity type. For example, in the fabrication of a PNP transistor of high resistivity P-type layer is deposited epitaxially on a heavily doped low resistivity P-type substrate. An adherent coating of nonconductive material is then formed on the surface of the layer. An N-type conductivity imparting material is diffused through an opening in the protective coating to convert a region of the underlying epitaxial layer to N-type conductivity. A P-type conductivity imparting material is then diffused through a smaller opening in the reconstituted protective coating to convert a portion of the N-type diffused region to P-type. Connections are made to the device so that it is operated with the unconverted high resistivity material of the epitaxial layer as the collector region, the diffused N-type region remaining after the P-TYPE diffusion as the base region and the double-diffused P-type region as the emitter region. The device has protected junctions between the emitter and the base regions and between the base and collector regions with their surface edges underlying the protective coating.

Devices of the foregoing type have very desirable electrical characteristics, however, they are subject to a phenomenon known as inversion layer formation or "channeling." Channeling is the condition in which majority charge carriers of the semiconductor material are repelled from and minority charge carriers are attracted toward the surface of the semiconductor body. Channels or tracks in which minority charge carriers are thus formed adjacent the surface of high resistivity lightly doped regions, specifically in the collector region of a double-diffused epitaxial transistor. These channels, in effect, become extensions of the adjoining regions of the other conductivity type, the base region.

The channels have an adverse effect on the electrical characteristics of the device. Their presence causes excessive leakage currents across the base-collector junction which, in effect, is uncontrollably increased in area. If the effective junction area is increased sufficiently to include a defect in the semiconductor material, severe degradation of the electrical characteristics of the device occurs. In addition, channels may extend completely across the collector region to the edge surfaces of the device. Since the protective nonconductive coating does not cover the edge surfaces, the edges of the junctions between the channels and the collector region are exposed to the action of contaminants. This condition causes severe deterioration of the electrical characteristics of the device.

It is believed that the formation of channels or inversion layers is caused by electrical charges which may be on the outer surface of the protective nonconductive coating adherent to the surface of the device, at the interface between the coating and the semiconductor surface, or within the nonconductive material of the coating. When these charges are of the same polarity as the majority carriers in the underlying semiconductor region, or when the net result of the charges produces an electrical field having the same effect at the surface of the semiconductor region, majority carriers of the semiconductor material of the region are repelled from and minority carriers are attracted toward the surface thus creating adjacent the surface a relatively large concentration of minority carriers. If the region is lightly doped high resistivity semiconductor material having a low density of majority charge carriers, the induced concentration of minority carriers is sufficient to invert the conductivity type of the material adjacent the surface creating inversion layers or channels.

It is an object of the present invention, therefore, to provide an improved semiconductor device.

It is also an object of the invention to provide a semiconductor device of the type having a high resistivity surface region in which the formation of channels in the surface region is prevented.

Briefly, a semiconductor device in accordance with the foregoing objects of the invention comprises a body of semiconductor material having a first zone of one conductivity type contiguous a second zone of the opposite conductivity type at a surface of the body. An adherent coating of nonconductive material on the surface of the body overlies the junction between the first and second zones adjacent the junction. A layer of conductive material on the coating of nonconductive material overlies the junction between the first and second zones and the portions of the first and second zones adjacent the junction. The overlying conductive layer serves to absorb, neutralize, or prevent the accumulation of charges thus eliminating or reducing the electrical effect on the carriers in the semiconductor material. The conductive layer may be separated physically and electrically from the semiconductor material, or it may be electrically connected to a zone of the body of semiconductor material thereby positively controlling the electrical potential effective at the semiconductor surface.

Figures 2, 3, 4, 5:
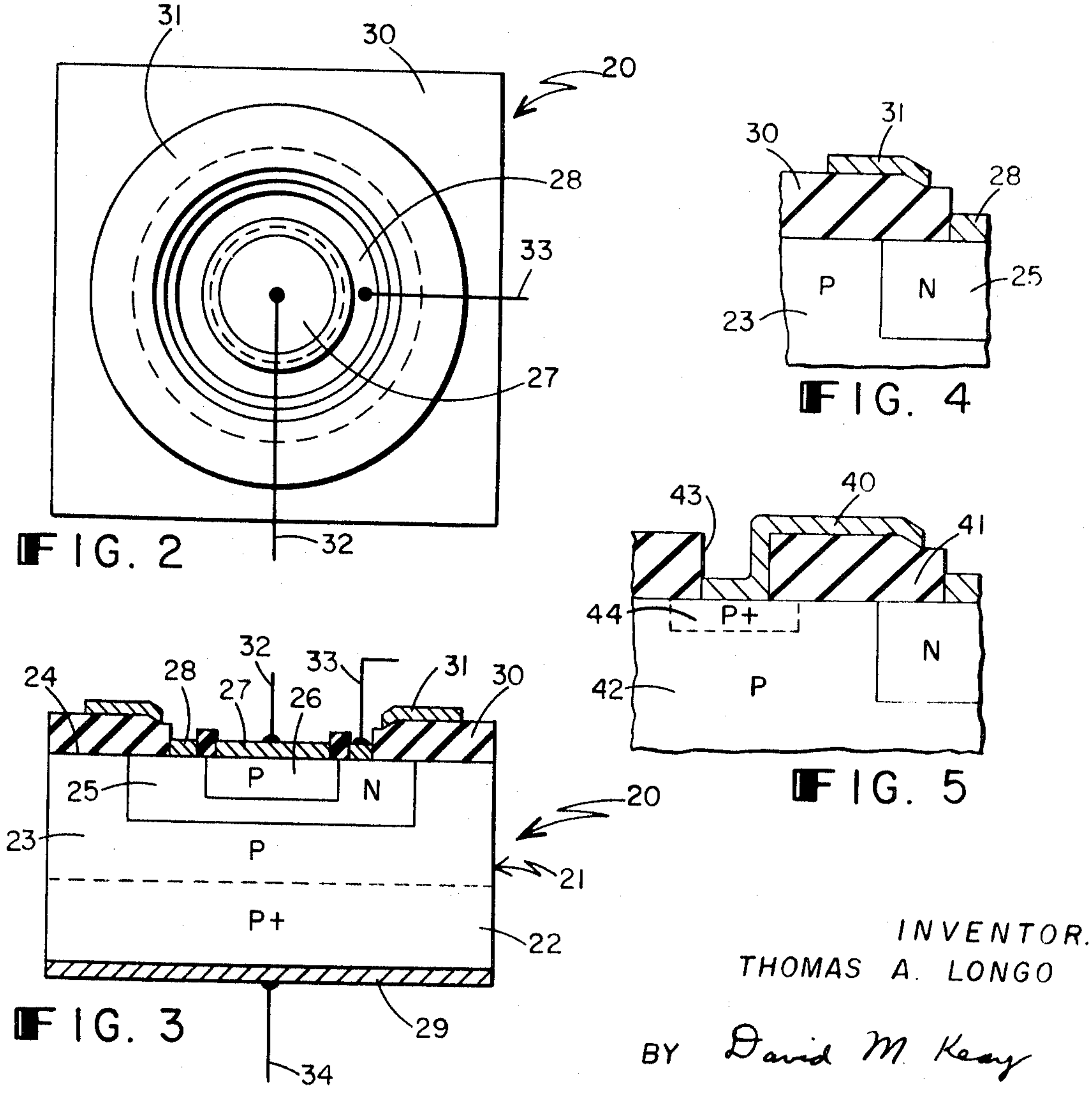

Additional objects, features, and advantages of semiconductor devices according to the invention will be apparent from the following detailed discussion and the accompanying drawings wherein:

FIG. 1 is an energy level diagram representing conditions adjacent the surface of high resistivity P-type semiconductor material displaying inversion, FIG. 2 is a plan view of a double-diffused transistor according to the invention, FIG. 3 is a cross-sectional view in elevation of the double-diffused transistor of FIG. 2, FIG. 4 is an enlarged cross-sectional view of a portion of the device illustrated in FIG. 3, and FIG. 5 is a cross-sectional view showing in detail a portion of another embodiment of the invention.

In the figures various sections of the semiconductor devices are not drawn to scale. Certain dimensions are exaggerated in relation to other dimensions in order to present a clearer understanding of the invention.

FIG. 1 is an energy level diagram illustrating the phenomenon of inversion or channeling adjacent the surface of lightly doped high resistivity semiconductor material of P-type conductivity. When a positive charge as indicated by the positive symbols (+) 10 occurs at the surface of the semiconductor material, charge carriers within the semiconductor material arrange themselves so as to maintain the surface electrically neutral.

The positive polarity at the surface may be caused by electrical charges on the surface of the protective nonconductive coating, at the interface between the coating and the semiconductor surface, or within the material of the protective coating. These charges may be ionized particles or they may be electrically neutral dipoles which for some reason become aligned so as to produce a field having a positive potential at the semiconductor surface.

Regardless of the cause of the accumulated positive surface charge 10, this condition is neutralized by the attractions of minority carriers, electrons in P-type material as indicated by the negative symbols (−) 11, toward the surface and the repulsion of majority carriers, holes in P-type material, from the surface. The Fermi level 12 of the semiconductor material must be adjusted to account for the increased concentration of minority carriers adjacent the surface. In the energy level diagram of FIG. 1 the Fermi level 12 is shown as a straight line and the energy bands of the material are shown as bending downward as the surface is approached. At the point of intersection of the Fermi level 12 and the intrinsic level 13, which lies midway between the valence band 14 and the conduction band 15, the semiconductor material changes conductivity type. Thus, the semiconductor material between the dashed line 16 and the surface becomes an inversion layer of N-type conductivity.

In devices according to the present invention the problem of surface inversion or channeling is eliminated by absorbing or neutralizing the effect of the accumulated charges have at the semiconductor surface to an extent sufficient to prevent inversion from taking place. A first embodiment of a PNP double-diffused transistor 20 according to the invention is illustrated in FIGS. 2 and 3 and in the enlarged detailed view of FIG. 4. The device includes a body of semiconductor material 21 having a region of low resistivity highly doped P-type conductivity 22. Adjoining the low resistivity P-type region 22 is a region 23 of high resistivity P-type material. This region extends to the major upper surface 24 of the body which is flat and parallel to the interface with the low resistivity P-type region 22.

The body includes an N-type region 25 also having a surface area in the surface 24 of the body. Within and surrounded by the N-type region 25, except at the surface, is another P-type region 26. The second P-type region 26 has a surface area in the surface of the body which is encircled by the surface area of the N-type region 25. Layers of conductive material 27 and 28 are in ohmic contact with portions of the surface areas of the second P-type region 26 and the N-type region 25 to provide emitter and base connections, respectively. A layer of conductive material 29 on the undersurface of the low resistivity P-type region 22 provides an ohmic collector connection.

The upper surface 24 of the body of semiconductor material except for those portions covered with conductive material 27 and 28 is covered with adherent nonconductive material 30. This coating overlies the edges of the PN junctions at the surface 24. As best seen in FIG. 4 the coating 30 extends over portions of the surface areas of the N-type region 25 and the P-type region 23 which are adjacent the junction.

A layer of conductive material 31 on the surface of the coating of nonconductive material 30 overlies the edge of the junction between the N-type region 25 and the P-type region 23 and the portions of these regions adjacent the junction. This conductive layer serves to protect the high resistivity semiconductor material of the P-type region 23 from the effects of an accumulated surface charge by absorbing or neutralizing electrical charges.

PNP double-diffused transistors as illustrated in FIGS. 2, 3, and 4 may be produced by a combination of epitaxial deposition techniques and the selective diffusion of conductivity-type imparting materials. The transistor may be fabricated in a slice of very low resistivity or degenerate P-type single crystal silicon heavily doped with boron. A layer of single crystal silicon of high resistivity P-type conductivity lightly doped with boron to produce a resistivity of about 3 ohm-centimeters is deposited on the substrate slice using known epitaxial deposition techniques.

An adherent protective silicon oxide coating is formed on the surface of the epitaxial layer. An opening is made in this coating by photoresist and etching techniques to expose an area on the surface of the layer. Phosphorus is diffused through this opening to convert an underlying portion of the epitaxial layer to N-type conductivity. Next, the oxide coating is reconstituted and an opening is made in the coating to expose a surface area of the diffused N-type region. Boron is diffused through the opening to reconvert an underlying portion of the diffused N-type region conductivity.

Openings are provided in the oxide coating delineating portions of the surface areas of the double-diffused N-type region and the diffused P-type region. Aluminum is then deposited on these exposed surface areas to provide ohmic contacts to the underlying regions of the body of semiconductor material. Aluminum is also deposited on the surface of the nonconductive coating overlying the edge of the junction between the diffused N-type region and the high resistivity P-type region and the portions of these regions adjacent the junction. The aluminum layers may be formed by the vapor deposition of aluminum over the entire upper surface of the device, and subsequent selective removal of aluminum by photoresist and etching techniques in order to leave only the desired conductive layers. Alternatively, aluminum may be deposited through a suitable mask or succession of masks to produce the desired pattern of conductive layers.

In the device as illustrated in the figures the heavily doped P-type region 22 is the original silicon substrate, and the remainder of the semiconductor body is the epitaxially grown layer. The P-type region 26 is the double-diffused P-type emitter region, and the N-type region 25 is the diffused N-type base region. The remaining portion of the epitaxial layer is the P-type collector region 23. The edges of all PN junctions lie at the upper surface 24 of the body and are protected by the oxide coating 30. The aluminum contacts 27 and 28 deposited on the surface of the body through openings in the oxide coating 30 together with lead wires 32 and 33 provide the emitter and base connections, respectively, of the device. The collector connection is provided by the metal plating 29 and the lead wire 34 on the underside of the substrate.

Although the action of the conductive layer 31 in preventing inversion at the surface of the high resistivity P-type region is not completely understood, it is believed to eliminate or reduce the cumulative effect of charged particles associated with the protective nonconductive coating. Since charged particles can flow freely throughout the conductive layer, localized concentrations of charges do not build up. In addition, the underlying oxide is shielded by the layer, and the conductivity of the layer permits electrical imbalances which do occur to neutralize themselves. In any event, banding of the energy bands relative to the Fermi level in the regions of the high resistivity semiconductor material adjacent the semiconductor surface as illustrated in the energy level diagram of FIG. 1 is eliminated or sufficiently reduced to prevent the formation of inversion layers or channels.

A second embodiment of a device according to the invention is shown in the detailed view of FIG. 5 which corresponds with the detailed view of the first embodiment shown in FIG. 4. In this embodiment, the conductive layer 40 overlying the nonconductive protective oxide coating 41 is electrically connected to the P-type high resistivity collector region 42. This result is achieved by forming an opening 43, or openings, in the oxide coating so as to expose the region of the surface area of the portion of the collector region adjacent the junction prior to deposition of the aluminum. The portion 44 of the collector region 42 at which the aluminum layer 40 makes contact to the semiconductor body may be more heavily doped in order to assure good ohmic contact.

This embodiment of the invention provides the advantages indicated hereinabove for the first embodiment in preventing channeling. In addition, with the collector region 42 and the conductive layer 40 at the same potential, electrical fields across the portion of the nonconductive coating 41 overlying the collector region 42 tend to be eliminated. Thus, the tendency for particles within the nonconductive material to become aligned electrically is reduced.

Although the examples presented in the foregoing discussion have concerned semiconductor devices with P-type regions of high resistivity, the teachings disclosed herein are clearly applicable to devices having high resistivity N-type regions. The phenomenon of channeling in N-type material takes place when the accumulated surface charges are effectively of negative polarity. Layers of conductive material over the nonconductive coating protect the underlying N-type material from the accumulation of negative charges similar to the manner in which they protect P-type material from the accumulation of positive charges.

What I claim is:

1. A semiconductor device comprising
a body of semiconductor material having a surface,
a first zone of said body of one conductivity type having a surface area in said surface of the body,
a second zone of said body of the opposite conductivity type lying intermediate said first zone and the remainder of said body and having a surface area in said surface of the body encircling the surface area of the first zone,
a third zone of the one conductivity type completely surrounding the portion of said body constituted by the first and second zones except at said surface and having a surface area in said surface of the body encircling the surface area of the second zone,
said first, second, and third zones cooperating to provide the emitter, base, and collector regions, respectively, of a transistor,
a coating of an adherent nonconductive material on said surface of the body overlying the edge of the junction between the second and third zones and the portions of the surface areas of the second and third zones adjacent the junction whereby all of the edge of the junction is covered by nonconductive material of the coating,
a layer of conductive material on the coating of nonconductive material, said layer of conductive material overlying the edge of the junction between the second and third zones and the portions of the surface areas of the second and third zones adjacent the junction whereby all of the edge of the junction lies under nonconductive material of said coating and conductive material of said layer,
ohmic connections to said first, second, and third zones, and connecting leads to each of said ohmic connections providing emitter, base, and collector connections,
all portions of said layer of conductive material being separated physically and electrically from the body of semiconductor material by nonconductive material of said coating, and said layer of conductive material being free of any electrical connection.

2. A semiconductor device comprising
a body of semiconductor material having a surface,
a first zone of said body of one conductivity type of graded resistivity having a surface area in said surface of the body,
a second zone of said body of the opposite conductivity type of graded resistivity lying intermediate said first zone and the remainder of said body and having a surface area in said surface of the body encircling the surface area of the first zone,
a third zone of the one conductivity type of high resistivity completely surrounding the portion of said body constituted by the first and second zones except at said surface and having a surface area in said surface of the body encircling the surface area of the second zone,
said first, second, and third zones cooperating to provide the emitter, base, and collector regions, respectively, of a transistor,
a coating of an adherent nonconductive material on said surface of the body overlying the edge of the junction between the second and third zones and the portions of the surface areas of the second and third zones adjacent the junction whereby all of the edge of the junction is covered by nonconductive material of the coating,
a layer of conductive material on the coating of nonconductive material, said layer of conductive material overlying the edge of the junction between the second and third zones and the portions of the surface areas of the second and third zones adjacent the junction whereby all of the edge of the junction lies under nonconductive material of said coating and conductive material of said layer,
ohmic connections to said first, second, and third zones, and connecting leads to each of said ohmic connections providing emitter, base, and collector connections,
all portions of said layer of conductive material being separated physically and electrically from the body of semiconductor material by nonconductive material of said coating, and said layer of conductive material being free of any electrical connection.

3. A semiconductor device comprising
a body of semiconductor material having a flat major surface,
a first zone of said body of one conductivity type of graded resistivity having a surface area in said surface of the body,
a second zone of said body of the opposite conductivity type of graded resistivity lying intermediate said first zone and the remainder of said body and having a surface area in said surface of the body encircling the surface area of the first zone,
a third zone of the one conductivity type of high resistivity completely surrounding the portion of said body constituted by the first and second zones except at said surface and having a surface area in said surface of the body encircling the surface area of the second zone,
said first, second, and third zones cooperating to provide the emitter, base, and collector regions, respectively, of a transistor,
a coating of an adherent nonconductive material on said surface of the body,
a first opening in said coating delineating a region of the surface area of the first zone free of nonconductive material,
a first layer of conductive material on said region of the surface area of the first zone in ohmic contact with the semiconductor material of the first zone,
a first connecting lead to said first layer of conductive material providing an emitter connection,
a second opening in said coating delineating a region of the surface area of the second zone free of nonconductive material,
a second layer of conductive material on said region of the surface area of the second zone in ohmic contact with the semiconductor material of the second zone,
a second connecting lead to said second layer of conductive material providing a base connection,
a third layer of conductive material on the coating of nonconductive material, said third layer of conductive material overlying the edge of the junction between the second and third zones and the portions of the surface areas of the second and third zones adjacent the junction whereby all of the edge of the junction at the surface lies under nonconductive material of said coating and conductive material of said third layer,
an ohmic connection to said third zone, and
a third connecting lead to said ohmic connection providing a collector connection,
all portions of said third layer of conductive material being separated physically and electrically from the body of semiconductor material by nonconductive material of said coating, and said third layer of conductive material being free of any electrical connection.